US007341825B2

(12) United States Patent
Bandic et al.

(10) Patent No.: US 7,341,825 B2
(45) Date of Patent: Mar. 11, 2008

(54) METHOD FOR PRODUCING HIGH RESOLUTION NANO-IMPRINTING MASTERS

(75) Inventors: Zvonimir Z. Bandic, San Jose, CA (US); Jui-Lung Li, San Jose, CA (US); Henry Hung Yang, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 90 days.

(21) Appl. No.: 11/442,097

(22) Filed: May 25, 2006

(65) Prior Publication Data

US 2007/0275332 A1    Nov. 29, 2007

(51) Int. Cl.
    *G03F 7/00*     (2006.01)
(52) U.S. Cl. .................. 430/320; 430/323; 430/324; 216/11
(58) Field of Classification Search .................. None
    See application file for complete search history.

(56) References Cited

U.S. PATENT DOCUMENTS

| | | | |
|---|---|---|---|
| 6,391,216 B1 | 5/2002 | Nakatani | |
| 6,576,562 B2 | 6/2003 | Ohuchi et al. | |
| 6,673,684 B1 | 1/2004 | Huang et al. | |
| 6,753,130 B1 | 6/2004 | Liu et al. | |
| 2003/0127429 A1* | 7/2003 | Ohgaki | 216/72 |
| 2004/0081798 A1* | 4/2004 | Lee et al. | 428/141 |
| 2004/0180551 A1 | 9/2004 | Biles et al. | |
| 2004/0191577 A1 | 9/2004 | Suwa et al. | |
| 2005/0170292 A1* | 8/2005 | Tsai et al. | 430/320 |

FOREIGN PATENT DOCUMENTS

| | | |
|---|---|---|
| JP | 61202353 | 9/1986 |
| JP | 62167869 | 7/1987 |
| JP | 3252936 | 11/1991 |
| JP | 11092971 | 4/1999 |
| JP | 51-135503 | 5/2003 |
| JP | 2003140356 | 5/2003 |
| JP | 2003338091 | 11/2003 |

OTHER PUBLICATIONS

Gan et al., "Modeling of Reverse Tone Etchback Shallow Trench Isolation Chemical Mechanical Polishing", Journal of Electrochemical Society, vol. 148, No. 3, Feb. 2001, p. G159-G165.

* cited by examiner

*Primary Examiner*—John A. McPherson
(74) *Attorney, Agent, or Firm*—D'Arcy H. Lorimer; Lorimer Labs

(57) ABSTRACT

A method for producing high resolution nano-imprinting masters is disclosed. The method inverts the negative features of an exposed and developed positive e-beam resist to positive features in the patterned silicon nitride layer of the nano-imprinting master. A first, oxidation resistant, mask layer is used to pattern a DLC layer deposited on the silicon nitride layer. After patterning the DLC layer, the negative features of the DLC layer are filled with deposited metal, which creates a second mask layer subsequent to the removal of the remaining DLC layer. The second mask layer is used to etch the silicon nitride layer, creating the final nano-imprinting master.

34 Claims, 7 Drawing Sheets

METHOD FOR PRODUCING HIGH RESOLUTION NANO-IMPRINTING MASTERS

BACKGROUND OF THE INVENTION

1. Field of the Invention

This invention relates to the formation of nano-imprinting master. More specifically, the invention relates to methods for producing high resolution, high aspect ratio nano-imprinting masters.

2. Description of the Related Art

A desired configuration for nano-imprinting masters, which are used to transfer sub-micron patterns to another media by physical contact, comprises a pattern having features extending above a substrate surface. These features generally have high aspect ratios in that they are much taller than they are wide, with the smallest features less than 50 nm in width. Generally, high aspect ratios are useful when transferring patterns into polymeric films or curable fluids, since the pattern accuracy is enhanced with deeper impressions in the receiving polymer media. Sub-micron features must be firmly adherent to the substrate, since as masters, they will be used repeatedly to transfer the patterns. Pulling the master from the polymeric films may create stiction or fluid friction forces that will dislodge loosely adherent features in the master.

The following describe two methods for making nano-imprinting masters disclosed in the prior art. One method uses a subtractive method whereby the transfer pattern is generated by etching material from a blanket layer deposited on a substrate. FIGS. 1(a)-(e) (Prior Art) illustrates the subtractive process. One starts in FIG. 1(a) with a blanket layer 104 deposited on substrate 102. Generally $SiN_x$ is used for layer 104 and a silicon substrate for 102. A negative e-beam photo resist layer 106 is then applied to layer 104 as in FIG. 1(b). Exposure and development produces patterned layer 106' as in FIG. 1(c). However, current negative e-beam resists are incapable of producing structures with a width D (ref 108) less than about 40 nm. Following etching of the $SiN_x$ layer 104, the remaining pattern dimensions D are too large to provide structures less than 40 nm, which are required for advanced pattern masters.

Another method of the prior art is an additive method, illustrated in FIG. 2(a)-(e) (Prior Art), 3 (Prior Art) and 4 (Prior Art). In this method an e-beam resist 202 is deposited directly on substrate 102, exposed and developed to form patterned layer 202'. This pattern is a negative image of the desired final pattern. The $SiN_x$ material 204 is then deposited over the e-beam resist patterned layer 202' as shown in FIG. 2(c). However, the deposition of $SiN_x$ material into narrow trenches is difficult, and may produce defects and voids 302 at the bottom of the trench as shown in FIG. 3 (Prior Art). Following planarization (FIG. 2(d) Prior Art) and resist removal, the finished master is shown in FIG. 2(e). The outlined detail of FIG. 4 (Prior Art) shows that this process may result in poorly adherent structures 204' due to voids and defects 302 at the interface with the substrate.

U.S. Pat. No. 6,753,130 discloses a method for patterning a carbon-containing substrate utilizing a patterned layer of a resist material as a mask and then safely removing the mask from the substrate without adversely affecting the substrate, comprising sequential steps of: (a) providing a substrate including a surface comprising carbon; (b) forming a thin metal layer on the substrate surface; (c) forming a layer of a resist material on the thin metal layer; (d) patterning the layer of resist material; (e) patterning the substrate utilizing the patterned layer of resist material as a pattern-defining mask; and (f) removing the mask utilizing the thin metal layer as a wet strippable layer or a plasma etch/ash stop layer. In this disclosure, the thin metal layer aids in transferring the pattern from the resist layer to the carbon substrate, and must be etched prior to oxidation of the carbon substrate. However, the suggested use of the preferred metal aluminum, may compromise pattern integrity because aluminum may oxide during the carbon substrate oxygen reactive ion etching step, altering the dimensions of the openings in the aluminum mask layer. For example, a 25 to 30 angstrom thick oxide, typical of the natural $Al_2O_3$ grown at room temperature, can produce a 5 to 6 nm error in the dimensions of the original Al mask openings. For dimensions less than 40 or 50 nm, this error is significant and unsuitable for the manufacture of high resolution masters. The same condition applies for other recommended metals such as copper and nickel, which are also oxidized in the carbon substrate oxygen based reactive ion etching step. The resist layer is of no help in defining the pattern transfer during the substrate oxidation, as it is also likely to be destroyed.

What is needed is a process for forming high resolution, high aspect ratio nano-imprinting masters that have good adhesion to the substrate and are capable of producing features below 40 nm.

U.S. Pat. No. 6,391,216 discloses a method for reactive-ion etching a magnetic material with a plasma of a mixed gas of carbon monoxide and a nitrogen-containing compound, the method comprising a step, in which a multilayered film comprising a magnetic material thin film having thereon a resist film formed on a substrate is exposed to an electron beam and then developed, to form a pattern on the resist film, a step, in which a mask material is vacuum deposited, a step, in which the resist is dissolved, to form a mask, and a step, in which a part of the magnetic material thin film that is not covered with the mask is removed by reactive ion etching with a plasma of a mixed gas of carbon monoxide and a nitrogen-containing compound, to form a pattern on the magnetic material thin film, and thus obtaining the magnetic material thin film finely worked.

U.S. Pat. No. 6,576,562 discloses a manufacturing method of semiconductor devices comprising forming a mask material having an aromatic ring and carbon content of 80 wt % or more on an object, forming a mask material pattern by etching the mask material to a desired pattern, and etching the object to transfer the mask material pattern as a mask to the object.

U.S. Pat. No. 6,673,684 discloses a method for producing an integrated circuit including providing a diamond layer above a layer of conductive material. A cap layer is provided above the diamond layer and patterned to form a cap feature. The diamond layer is patterned according to the cap feature to form a mask, and at least a portion of the layer of conductive material is removed according to the mask.

U.S. Patent Application 2004/0180551 discloses a carbon hard mask for patterning an aluminum layer in a microelectronics device. The carbon hard mask will release carbon during a reactive ion etch process, thereby eliminating the need to use $CHF_3$ as a passivation gas. Portions of the carbon hard mask remaining after the RIE process are removed during the subsequent strip passivation process without the need for a separate mask removal step.

Japanese Patent JP11092971 discloses a process to enable simple etching with high resolution and accuracy by constituting a mask of Ti, Mg, Al, Ge, Pt, Pd; single metals and alloys or compounds essentially comprising one or more of these elements. Ti, Mg, Al, Ge, Pt, Pd, alloys or compounds essentially comprising these elements, hardly react with a CO—NH$_3$ gas plasma, so they are suitable as a mask material. Especially Ti, its alloys, or compounds essentially comprising Ti are excellent. By using a mask comprising these materials, redeposition of contaminant on the objective material for etching does not occur, and sharp and accurate etching is possible. The objective material of etching is preferably a magnetic material permalloy or the like. When a resist film is used for pattern forming, various kinds of organic polymer films are used. The etching plasma gas is preferably a mixture gas of CO and a nitrogen-containing compound such as NH$_3$ and amines.

Japanese Patent JP2003140356 discloses a method for forming a fine pattern including processes of depositing a mask material on a pattern formed on the surface of a second resist film, on the objective substrate, and then removing a first resist film and the second resist film to form the arrangement of a dot pattern made of the mask material on the objective substrate. This method is characterized in that the mask material used contains fine particles having aggregates of carbon atoms as the structural element.

Japanese Patent JP1202353 discloses a dielectric film selected from the group consisting of germanium nitride, titanium nitride, boron nitride, chromium nitride, zirconium nitride, cobalt nitride, phosphorus nitride silicon carbide, tungsten carbide, titanium carbide, chromium carbide, molybdenum carbide and zirconium carbide formed on a glass substrate to the thickness corresponding to the depth of the desired signal pits or guide grooves by a vacuum thin film forming technique. A resist pattern having the pattern of the desired signal pits or guide grooves is then formed thereon and the dielectric film exposed through the resist pattern is removed by etching and thereafter the resist pattern is removed.

Japanese Patent JP3252936 discloses a hard carbon nitride film formed as an etching layer on a substrate, on which a resist film is formed by coating. After exposing the photoresist film to irradiation of laser light, and developing, a resist pattern is formed to be used as a mask for etching of the hard carbon film. By removing the resist remaining on the surface, the surface protective film comprising boron nitride is thus obtained. As for the etching layer, thin film of aluminum, chromium, silicon, or oxides of these, or the substrate itself can be used instead of the hard carbon film. Thus durability of a stamper is improved.

Japanese Patent JP62167869 discloses a pattern formed by a photoresist on the substrate consisting of glass, and thereafter a Si film is formed thereon by vapor deposition. The substrate patterned with the Si film formed by removing the photoresist with a stripping liquid is subjected to the plasma polymerization with CH$_4$ as an introducing gas to form about 0.5 micron i-carbon film. Cr is deposited thereon by evaporation to about 1000 Angstrom as the layer to adhere the metallic film to glass and thereafter. Ni is deposited by evaporation to about 1 micron on the metallic film to be patterned. Since the Cr has the good adhesiveness to glass, the Ni film is deposited on the substrate surface. The i-carbon surface has the weak adhesive power to both the Cr and Ni and therefore the film exfoliates gradually after the vapor deposition and the pattern is formed only on the surface exposed by the film.

SUMMARY OF THE INVENTION

It is an object of the present invention to provide a method for fabricating an imprinting master including providing a substrate having a surface comprising silicon nitride, forming a DLC layer on the surface of the substrate, and forming a first mask layer on the DLC layer. The first mask layer is selected from the group consisting essentially of Au, Pd, Pt, Ir, Rh, alloys of the forgoing, and polysilicon. The method further includes creating a patterned first mask by patterning the first mask layer, creating a patterned DLC mask by transferring a pattern from the patterned first mask to the DLC layer by etching the DLC layer, depositing a second mask layer over the patterned DLC mask and the patterned first mask, creating a second patterned mask from the second mask layer by first removing the patterned first mask and subsequently removing the patterned DLC mask. The pattern is inverted by etching the surface of the substrate using the second patterned mask as a pattern-defining template.

It is another object of the present invention to provide a method for fabricating an imprinting master including providing a substrate having a surface comprising silicon nitride, forming a DLC layer on the surface of the substrate, and forming a first mask layer on the DLC layer. The first mask layer is selected from the group consisting essentially of Au, Pd, Pt, Ir, Rh, alloys of the forgoing, and polysilicon. The method includes forming a positive e-beam resist layer on the first mask layer, creating a patterned resist mask by producing a pattern in the positive e-beam resist layer, and creating a patterned first mask by etching the first mask layer using the patterned resist mask to transfer the pattern to the first mask layer. The method further includes creating a patterned DLC mask by transferring the pattern from the patterned first mask to the DLC layer by etching the DLC layer, depositing a second mask layer over the patterned DLC mask and the patterned first mask, creating a second patterned mask from the second mask layer by first removing the patterned first mask and subsequently removing the patterned DLC mask. The pattern is inverted by etching the surface of the substrate using the second patterned mask as a pattern-defining template.

It is yet another object of the present invention to provide a method for fabricating an imprinting master including providing a substrate having a surface comprising silicon nitride, forming a DLC layer on the surface of the substrate, and forming a first mask layer on the DLC layer. The first mask layer is selected from the group consisting essentially of Au, Pd, Pt, Ir, Rh, alloys of the forgoing, and polysilicon. The method further includes creating a patterned first mask by patterning the first mask layer, creating a patterned DLC mask by transferring a pattern from the patterned first mask to the DLC layer by etching the DLC layer, depositing a second mask layer over the patterned DLC mask and the patterned first mask, removing the patterned first mask by planarization, and creating a second patterned mask from the second mask layer by removing the patterned DLC mask. The pattern is inverted by etching the surface of the substrate using the second patterned mask as a pattern-defining template.

BRIEF DESCRIPTION OF THE DRAWINGS

The present invention will be better understood when consideration is given to the following detailed description thereof. Such description makes reference to the annexed drawings, wherein.

DETAILED DESCRIPTION OF THE PREFERRED EMBODIMENTS

As previously discussed in the Background section, production of imprinting masters with features less than about 50 nm in width is not possible utilizing current positive e-beam resists and directly etching the substrate surface in a subtractive process. The present invention provides a simple and economical method for producing a modified subtractive process which does not have the pattern feature adhesion problems of an additive process, and utilizes currently available positive e-beam resists to produce minimum feature sizes below 50 nm.

FIGS. 1-4 have been previously discussed in the Background section.

Figure 1A:
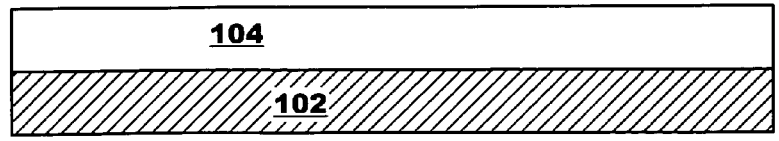
FIGS. 1(a)-(e) (Prior Art) are partial cross sectional views of a subtractive process for making a nano-imprinting master.
Figure 1B:
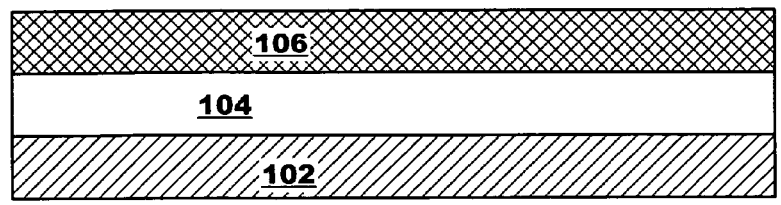
Figure 1C:
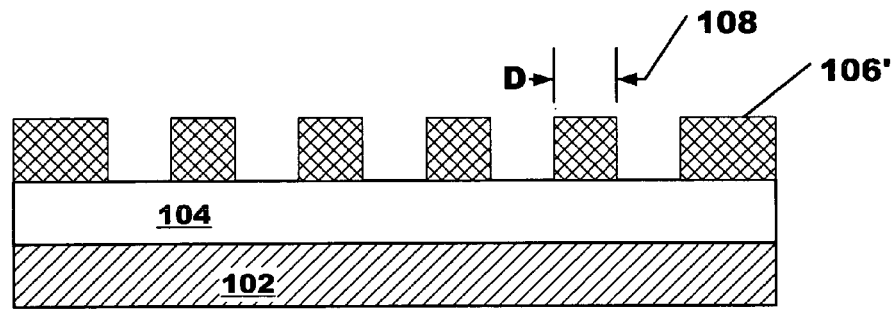
Figure 1D:
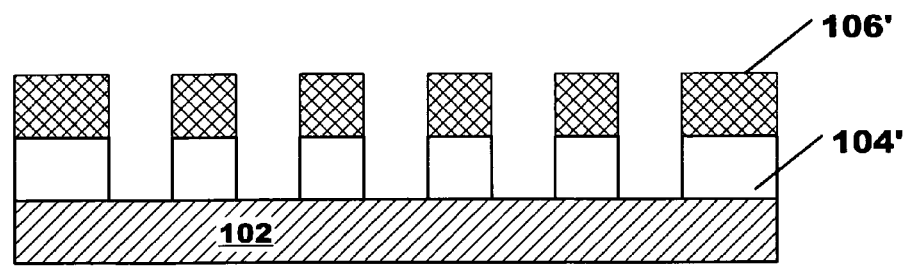
Figure 1E:
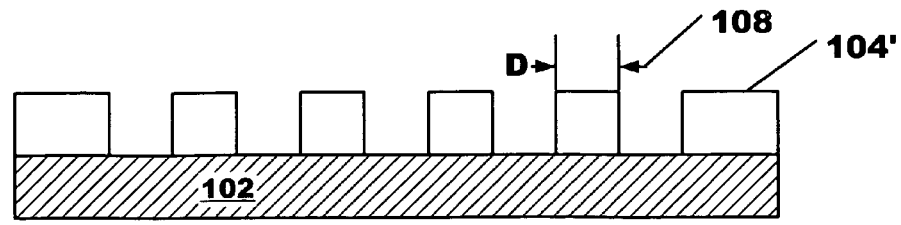
Figure 2A:
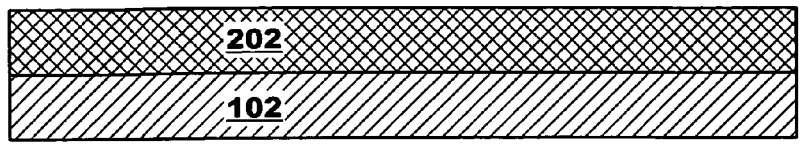
FIGS. 2(a)-(e) (Prior Art) are partial cross sectional views of an additive process for making a nano-imprinting master.
Figure 2B:
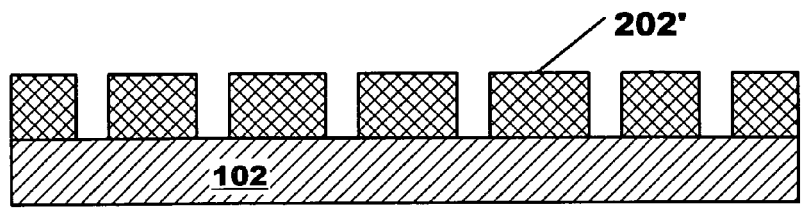
Figure 2C:
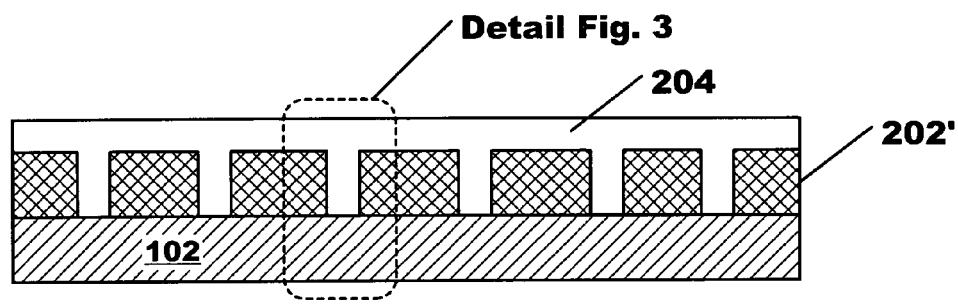
Figure 2D:
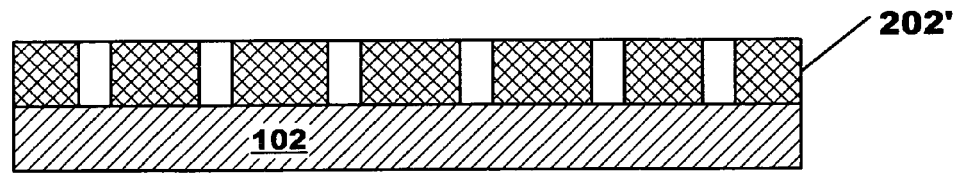
Figure 2E:
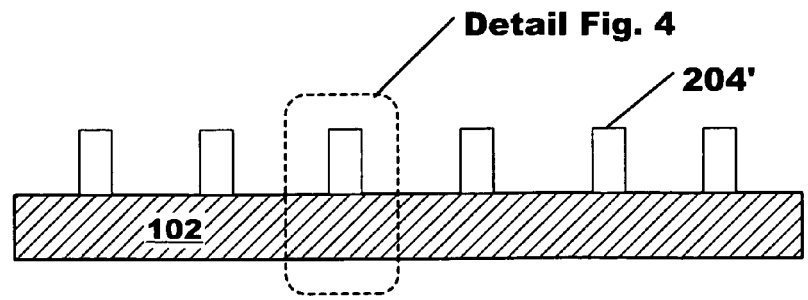
Figure 3:
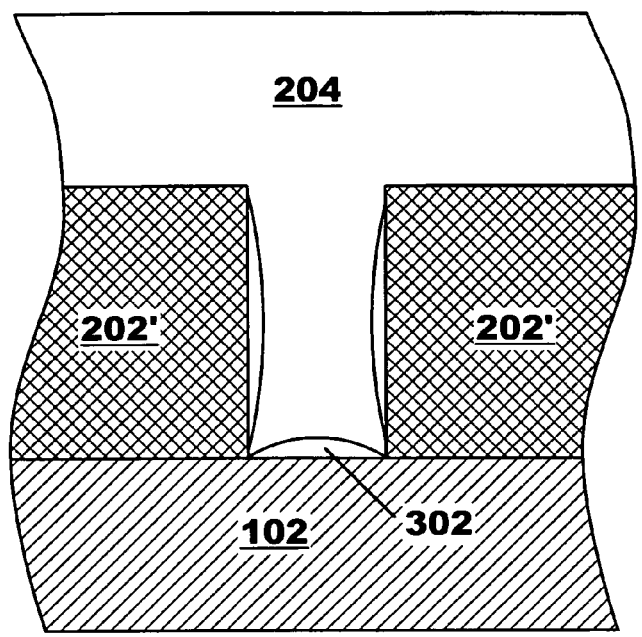
FIG. 3 (Prior Art) is a detail view of FIG. 2(c)
Figure 4:
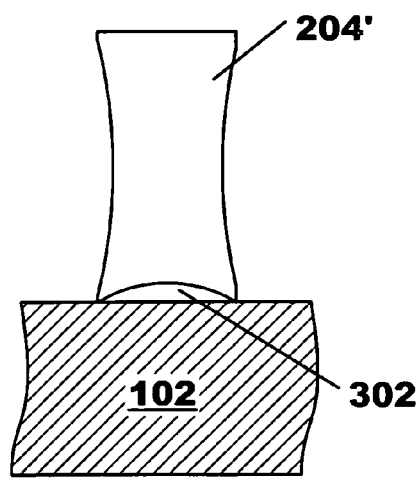
FIG. 4 (Prior Art) is a detail view of FIG. 2(e)
Figure 5:
FIG. 5 is a partial cross sectional view of a $SiN_x$ layer deposited on a substrate according to an embodiment of the present invention.

FIG. 5 is a partial cross sectional view 500 of a $SiN_x$ layer 104 deposited on a substrate 102 according to an embodiment of the present invention. This is the first step in the process. Substrate 102 can be any convenient rigid material known to those of skill in the art to be compatible with $SiN_x$ layer 104, but is preferably silicon. It may also be bulk $SiN_x$, whereby layer 104 may be unnecessary. An advantage of the present invention is that $SiN_x$ deposition can be carried out at the optimum conditions for adhesion to substrate 102, which may be at elevated temperatures in excess of what is desirable once a sub-micron pattern is present. On the exposed surface of $SiN_x$ layer 104, a diamond like carbon (DLC) layer 602 is deposited in accordance with methods well known to those skilled in the art. Subsequent to DLC layer 602 deposition, a first mask layer 604 is deposited over the DLC layer 602.

Figure 6:
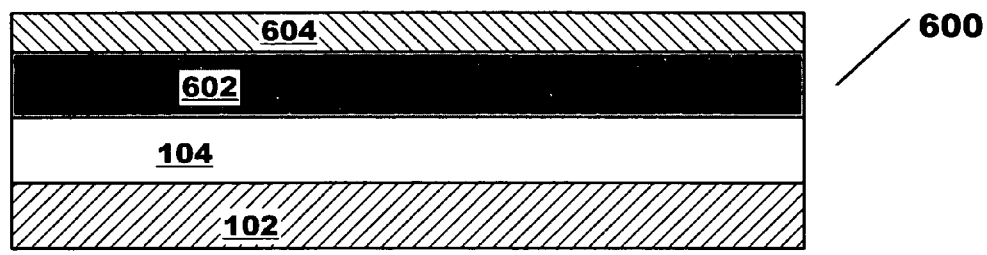
FIG. 6 is a partial cross sectional view of DLC and first mask layers deposited on the $SiN_x$ layer according to an embodiment of the present invention.

FIG. 6 is a partial cross sectional view 600 of DLC layer 602 and first mask layer 604 deposited on the $SiN_x$ layer 104 according to an embodiment of the present invention. First mask layer 604 will be utilized to transfer a pattern from a subsequently applied positive e-beam resist layer (see FIG. 7) to DLC layer 602. Since etching of the DLC layer is accomplished in highly oxidizing chemical environments, first mask layer 604 must be composed of a material resistant to oxidation. This is required in order to preserve the dimensional fidelity of nm sized patterns of the final nano-imprinting master. Oxide layers as thin as 10 or 20 angstroms can create significant errors when patterning openings below 40 nm. Materials suitable for the first mask layer may be chosen from the group consisting of precious metals such as gold, palladium, platinum, iridium, ruthenium, rhodium and their alloys; germanium, and polysilicon. Preferably, precious metals are used, most preferably gold is used. The deposition of these materials is well known to those skilled in the art, and may include methods such as chemical vapor deposition, sputtering, and vapor deposition by evaporation. Film thickness of the first mask layer is generally between 10 and 200 nm. Subsequent to the deposition of the first mask layer 604, positive e-beam resist layer 702 is applied.

Figure 7:
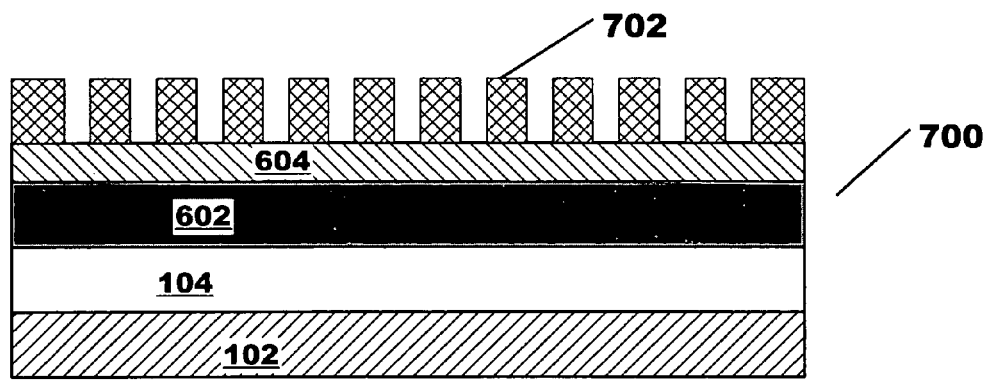
FIG. 7 is a partial cross sectional view subsequent to the deposition, imaging, and developing of an e-beam resist layer according to an embodiment of the present invention.

FIG. 7 is a partial cross sectional view 700 subsequent to the deposition, imaging, and developing of an e-beam resist layer 702 according to an embodiment of the present invention. In the following discussion, "negative" features refer to the "trenches" or cut out areas in a mask layer; "positive" features refer to the solid areas or the areas remaining after etching of the pattern into the mask layer. The negative features of e-beam resist layer 702 will eventually be inverted to positive features in layer 104 of the final nano-imprinting mask (see FIG. 14). The deposition, exposure, and development of the positive e-beam resist is well known to those skilled in the art. An advantage of the present invention is the use of a positive e-beam resist, which is capable of producing the resolution (<40 nm) required.

Figure 8:
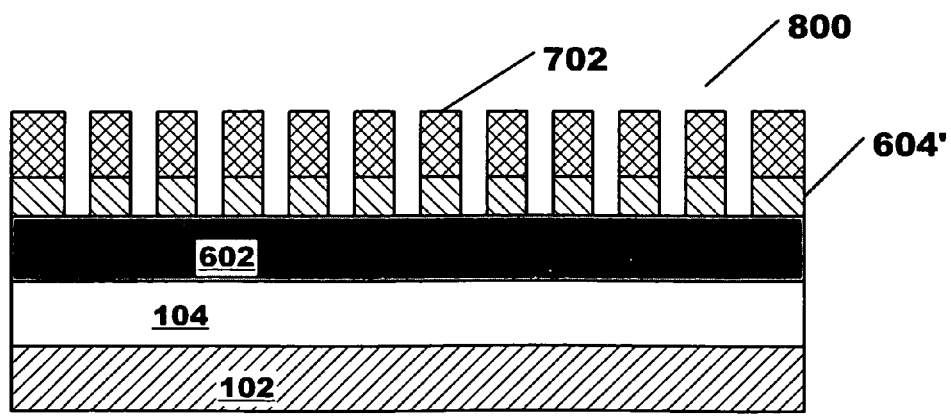
FIG. 8 is a partial cross sectional view subsequent to etching of the first mask layer according to an embodiment of the present invention.

FIG. 8 is a partial cross sectional view 800 subsequent to etching of the first mask layer 604 according to an embodiment of the present invention. Negative features of e-beam resist layer are transferred to the patterned first mask layer 604' by etching first mask layer 604. For layers 604 comprising precious metals such as gold or palladium, ion milling is used to perform the pattern transfer. For materials such as Ge or polysilicon, reactive ion etch (RIE) or ion milling processes can be used. The process conditions and methods for ion milling and RIE processes are well known to those skilled in the art. Since DLC layers are highly resistant to the ion milling and RIE processes used to etch layer 604, the etching process generally stops at the interface between DLC layer 602 and layer 604.

Figure 9:
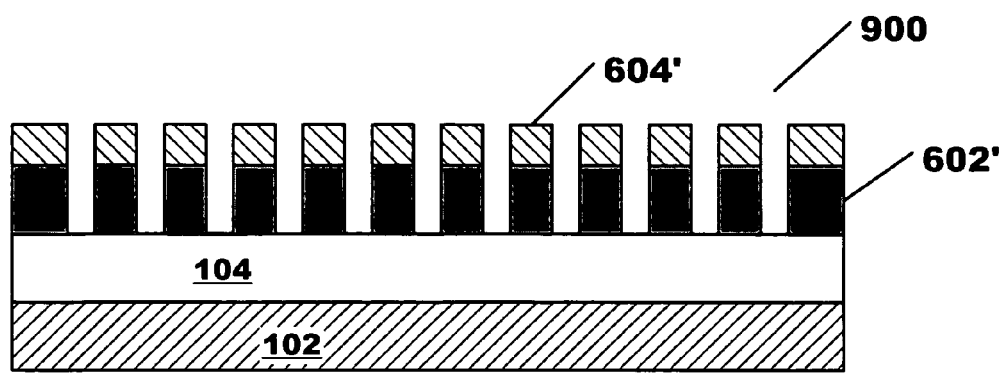
FIG. 9 is a partial cross sectional view subsequent to etching of the DLC layer according to an embodiment of the present invention.

FIG. 9 is a partial cross sectional view 900 subsequent to etching of the DLC layer 602 according to an embodiment of the present invention. Negative features of the patterned first mask layer 604' are transferred to the patterned DLC layer 602' by etching DLC layer 602. The etching of the DLC layer is accomplished in a plasma assisted oxidizing etch, in accordance with conditions well known to those skilled in the art. These conditions will generally damage, if not destroy resist layer 702, so first mask layer 604' must be relied upon to transfer the pattern accurately to the DLC layer during the oxidizing etch. It is an advantage of the present invention that the preferred materials disclosed undergo minimal oxidation during the DLC layer etch, thus preserving the pattern fidelity of the patterned e-beam resist layer 702. Removal of the resist layer 702 may be accomplished before, during, or after the oxidizing etch of the DLC layer. Preferably, removal of the resist layer is accomplished during the oxidizing etch, since this potentially saves a separate stripping step. However, if oxidizing etch conditions are unable to completely remove the resist, it is preferable to remove the resist prior to the oxidizing etch so that debris from the resist does not interfere with accurate etching of the DLC layer. Removal of the resist layer prior to oxidation also reduces the depth of the channels formed during etching the DLC layer (by the thickness of the resist layer), improving the speed and accuracy of the pattern transfer.

Figure 10:
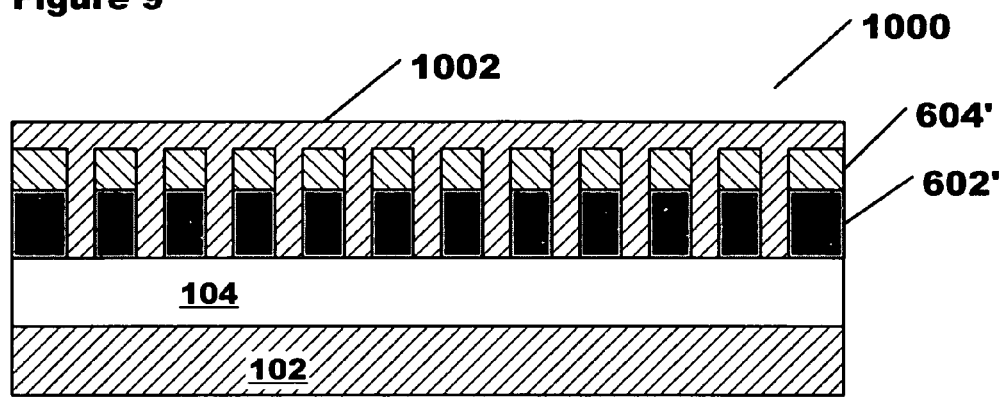
FIG. 10 is a partial cross sectional view subsequent to deposition of a second mask layer according to an embodiment of the present invention.

FIG. 10 is a partial cross sectional view 1000 subsequent to deposition of a second mask layer 1002 according to an embodiment of the present invention. Second mask layer 1002 is generally comprised of a metal, chosen from the group consisting of Cu, Ag, Ni, Au, Pd, Pt, Ir, Ru, Rh and their alloys. Preferably, Cu or Ni are used. Metals comprising the second mask layer may be deposited by vapor deposition (evaporation, CVD, or sputtering) or electroplating. Electroplating may require deposition of a conductive seed layer by vapor deposition as is well known to those skilled in the art. Deposition is carried out to the degree required to fill the negative features of at least the DLC layer 602'. Filling of the negative features within the first mask layer 604' is not required. Subsequent to the deposition of the second mask layer 1002, a portion of layer 1002 and patterned layer 604' are removed by planarization. The planarization step removes the requirement for a separate step to remove the first mask layer 604' prior to deposition of the second mask layer 1002.

Figure 11:
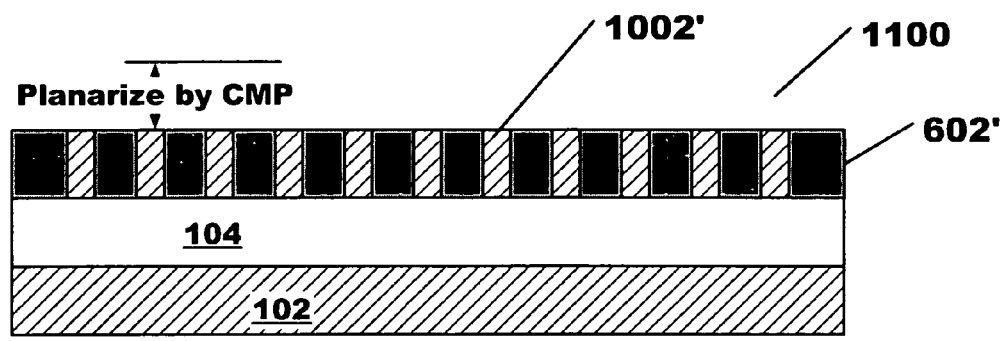
FIG. 11 is a partial cross sectional view subsequent to planarization of the first and second mask layers according to an embodiment of the present invention.

FIG. 11 is a partial cross sectional view 1100 subsequent to planarization of the first and second mask layers according to an embodiment of the present invention. Planarization is carried out via a CMP (chemical-mechanical planarization) process, wherein the upper surface (interface between layers 602' and 604') of the DLC layer 602' acts as a planarization stop, due to the hardness of the DLC material compared to the softer materials in layers 604' and 1002. The planarization process removes layer 604', exposing the top surface of the DLC layer 602', enabling subsequent removal of the DLC layer 602' via a plasma assisted oxygen-based reactive ion etching step. Material remaining in the patterned second mask layer 1002' is not subject to removal in the oxidation process.

Figure 12:
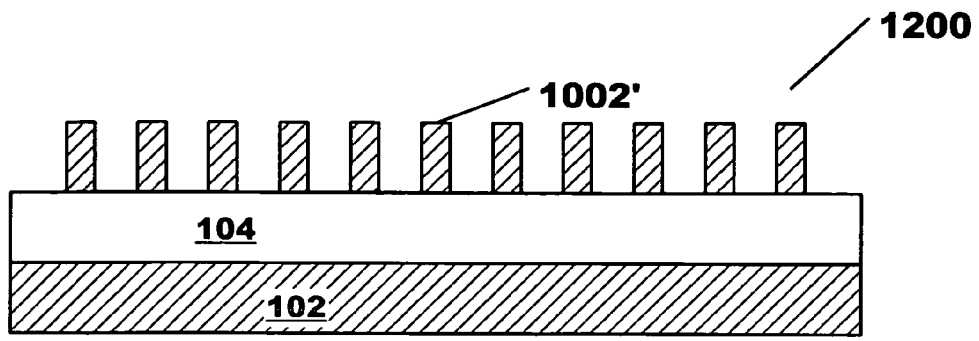
FIG. 12 is a partial cross sectional view subsequent to the removal of the DLC mask layer according to an embodiment of the present invention.

FIG. 12 is a partial cross sectional view 1200 subsequent to the removal of the DLC mask layer 602' according to an embodiment of the present invention. Following oxygen-based reactive ion etching of the DLC material, a patterned second mask layer 1002' remains on the surface of the $SiN_x$ layer 104. Positive features of mask layer 1002' mirror the negative features of the e-beam resist layer 702, completing the pattern inversion. The pattern is transferred to the $SiN_x$ layer 104 directly by etching.

Figure 13:
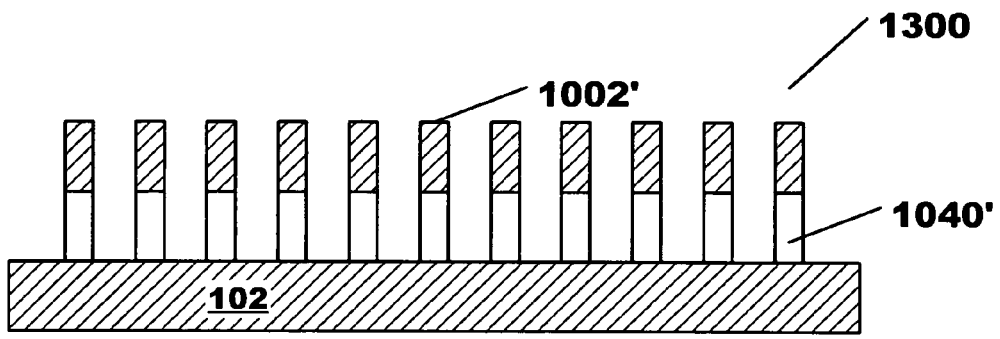
FIG. 13 is a partial cross sectional view subsequent to the etching of the $SiN_x$ layer according to an embodiment of the present invention.

FIG. 13 is a partial cross sectional view 1300 subsequent to the etching of the $SiN_x$ layer 104 according to an embodiment of the present invention. The etching is carried out via an RIE process utilizing $CHF_3$, $CF_4$ or other fluorine-based gases as is well known to those skilled in the art. Materials comprising mask layer 1002' are not removed in the RIE etch process, serving to maintain pattern fidelity during the etch.

Figure 14:
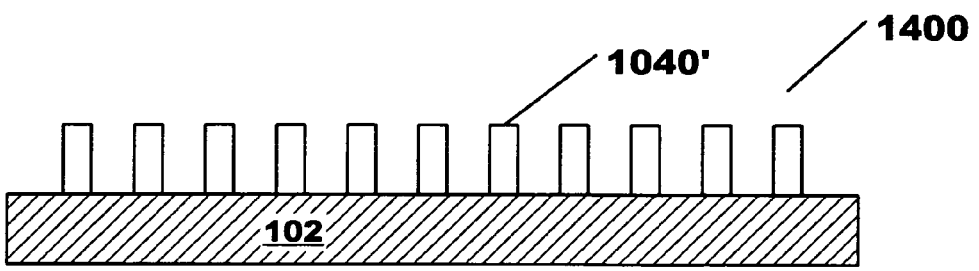
FIG. 14 is a partial cross sectional view of the finished nano-imprinting mask subsequent to the removal of the second mask layer according to an embodiment of the present invention; and, FIG. 15 is a block diagram of a deposition process for forming nano-imprinting masters according to an embodiment of the present invention.

FIG. 14 is a partial cross sectional view 1400 of the finished nano-imprinting mask subsequent to the removal of the patterned second mask layer 1002' according to an embodiment of the present invention. Generally, this layer 1002' is removed by wet chemical etching. For example, Au and other precious metals can be removed by aqua-regia (mixtures of HCl and $HNO_3$ acids). Cu and Ni can be removed by nitric acid or other common reagents.

Figure 15:
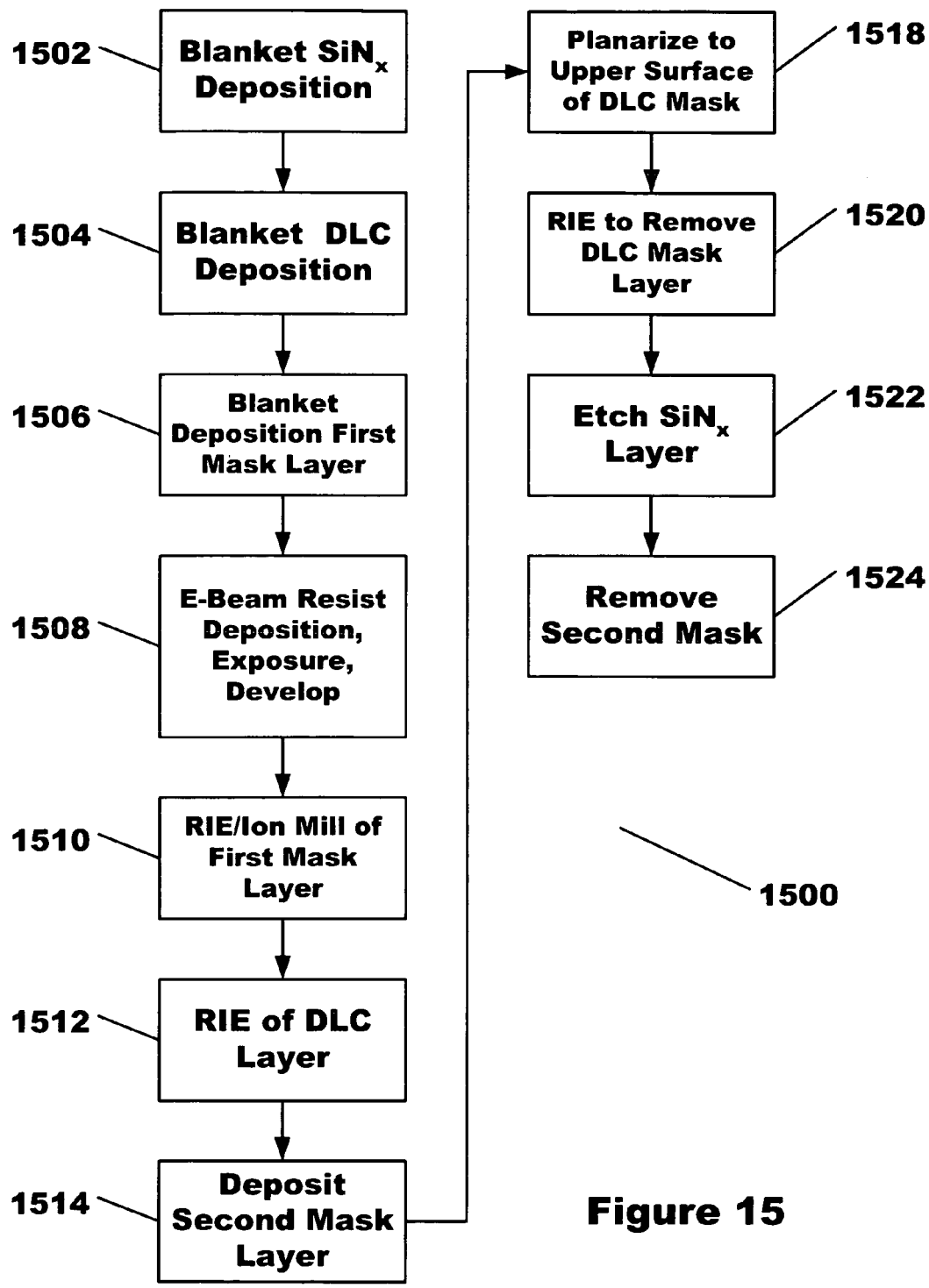

FIG. 15 is a block diagram 1500 of a deposition process for forming nano-imprinting masters according to an embodiment of the present invention. In a first step 1502, corresponding to FIG. 5, a blanket $SiN_x$ layer is deposited on a suitable substrate. This step is optional if a $SiN_x$ substrate is used. In step 1504, corresponding to FIG. 6, a blanket layer of DLC is deposited on the exposed $SiN_x$ surface. In step 1506, corresponding to FIG. 6, a first mask layer is deposited on the DLC layer. In step 1508, corresponding to FIG. 7, a positive e-beam resist is deposited on the first mask layer, exposed, and developed. In step 1510, corresponding to FIG. 8, the first mask layer is ion milled or reactive ion etched to transfer the negative features of the e-beam resist to the patterned first mask layer. In step 1512, corresponding to FIG. 9, the DLC layer is etched in an oxygen-based reactive ion etch, transferring the negative features of the patterned first mask layer to the patterned DLC layer. In step 1514, corresponding to FIG. 10, a second mask layer is deposited over the exposed surfaces of the patterned DLC layer and the patterned first mask layer. In step 1518, corresponding to FIG. 11, the patterned first mask layer and portions of the second mask layer are removed by planarization, exposing the upper surface of the patterned DLC layer. In step 1520, corresponding to FIG. 12, the patterned DLC layer is removed by an oxidizing etch, leaving a patterned second mask layer on the silicon nitride layer. In step 1522, corresponding to FIG. 13, the silicon nitride layer is etched. In step 1524, corresponding to FIG. 14, the patterned second mask layer is removed, producing a high resolution nano-imprinting master of the present invention.

The present invention is not limited by the previous embodiments heretofore described. Rather, the scope of the present invention is to be defined by these descriptions taken together with the attached claims and their equivalents.

What is claimed is:

1. A method for fabricating an imprinting master comprising:
   providing a substrate having a surface comprising silicon nitride;
   forming a DLC layer on said surface of said substrate;
   forming a first mask layer on said DLC layer, said first mask layer selected from the group consisting essentially of Au, Pd, Pt, Ir, Rh, alloys of the forgoing, and polysilicon;
   creating a patterned first mask by patterning said first mask layer;
   creating a patterned DLC mask by transferring a pattern from said patterned first mask to said DLC layer by etching said DLC layer;
   depositing a second mask layer over said patterned DLC mask and said patterned first mask;
   creating a second patterned mask from said second mask layer by first removing said patterned first mask and subsequently removing said patterned DLC mask; and,
   inverting said pattern by etching said surface of said substrate using said second patterned mask as a pattern-defining template.

2. The method as recited in claim 1, wherein creating a patterned first mask further comprises:
   forming a positive e-beam resist layer on said first mask layer;

creating a patterned resist mask by producing said pattern in said positive e-beam resist layer; and,
etching said first mask layer using said patterned resist mask to transfer said pattern to said first mask layer.

3. The method as recited in claim 2, wherein said first mask layer is etched using ion milling.

4. The method as recited in claim 2, wherein said patterned resist mask is removed during etching of said DLC layer.

5. The method as recited in claim 2, wherein said patterned resist mask is removed prior to etching of said DLC layer.

6. The method as recited in claim 1, wherein said DLC layer is etched in an oxidizing gas environment.

7. The method as recited in claim 1, wherein said patterned DLC mask has negative features created by etching said DLC layer, said second mask layer filling at least a portion of said negative features.

8. The method as recited in claim 1, wherein creating a second patterned mask from said second mask layer further comprises:
removing said patterned first mask by planarization; then,
removing said patterned DLC mask by etching in an oxidizing gas environment.

9. The method as recited in claim 8, wherein said patterned first mask is removed by CMP.

10. The method as recited in claim 1, wherein said second mask layer comprises Cu, Ag, Ni, Au, Pd, Pt, Ir, Ru, Rh and their alloys.

11. The method as recited in claim 1, wherein said second mask layer comprises Cu or Ni.

12. The method as recited in claim 1, wherein said second mask layer is electroplated.

13. A method for fabricating an imprinting master comprising:
providing a substrate having a surface comprising silicon nitride;
forming a DLC layer on said surface of said substrate;
forming a first mask layer on said DLC layer, said first mask layer selected from the group consisting essentially of Au, Pd, Pt, Ir, Rh, alloys of the forgoing, and polysilicon;
forming a positive e-beam resist layer on said first mask layer;
creating a patterned resist mask by producing a pattern in said positive e-beam resist layer;
creating a patterned first mask by etching said first mask layer using said patterned resist mask to transfer said pattern to said first mask layer;
creating a patterned DLC mask by transferring said pattern from said patterned first mask to said DLC layer by etching said DLC layer;
depositing a second mask layer over said patterned DLC mask and said patterned first mask;
creating a second patterned mask from said second mask layer by first removing said patterned first mask and subsequently removing said patterned DLC mask; and,
inverting said pattern by etching said surface of said substrate using said second patterned mask as a pattern-defining template.

14. The method as recited in claim 13, wherein said first mask layer is etched using ion milling.

15. The method as recited in claim 13, wherein said patterned resist mask is removed during etching of said DLC layer.

16. The method as recited in claim 13, wherein said patterned resist mask is removed prior to etching of said DLC layer.

17. The method as recited in claim 13, wherein said DLC layer is etched in an oxidizing gas environment.

18. The method as recited in claim 13, wherein said patterned DLC mask has negative features created by etching said DLC layer, said second mask layer filling at least a portion of said negative features.

19. The method as recited in claim 13, wherein creating a second patterned mask from said second mask layer further comprises:
removing said patterned first mask by planarization; then,
removing said patterned DLC mask by etching in an oxidizing gas environment.

20. The method as recited in claim 19, wherein said patterned first mask is removed by CMP.

21. The method as recited in claim 13, wherein said second mask layer comprises Cu, Ag, Ni, Au, Pd, Pt, Ir, Ru, Rh and their alloys.

22. The method as recited in claim 13, wherein said second mask layer comprises Cu or Ni.

23. The method as recited in claim 13, wherein said second mask layer is electroplated.

24. A method for fabricating an imprinting master comprising:
providing a substrate having a surface comprising silicon nitride;
forming a DLC layer on said surface of said substrate;
forming a first mask layer on said DLC layer, said first mask layer selected from the group consisting essentially of Au, Pd, Pt, Ir, Rh, alloys of the forgoing, and polysilicon;
creating a patterned first mask by patterning said first mask layer;
creating a patterned DLC mask by transferring a pattern from said patterned first mask to said DLC layer by etching said DLC layer;
depositing a second mask layer over said patterned DLC mask and said patterned first mask;
removing said patterned first mask by planarization;
creating a second patterned mask from said second mask layer by removing said patterned DLC mask; and,
inverting said pattern by etching said surface of said substrate using said second patterned mask as a pattern-defining template.

25. The method as recited in claim 24, wherein creating a patterned first mask further comprises:
forming a positive e-beam resist layer on said first mask layer;
creating a patterned resist mask by producing said pattern in said positive e-beam resist layer; and,
etching said first mask layer using said patterned resist mask to transfer said pattern to said first mask layer.

26. The method as recited in claim 25, wherein said first mask layer is etched using ion milling.

27. The method as recited in claim 25, wherein said patterned resist mask is removed during etching of said DLC layer.

28. The method as recited in claim 25, wherein said patterned resist mask is removed prior to etching of said DLC layer.

29. The method as recited in claim 24, wherein said DLC layer is etched in an oxidizing gas environment.

30. The method as recited in claim 24, wherein said patterned DLC mask has negative features created by etching said DLC layer, said second mask layer filling at least a portion of said negative features.

31. The method as recited in claim 24, wherein said patterned first mask is removed by CMP.

32. The method as recited in claim 24, wherein said second mask layer comprises Cu, Ag, Ni, Au, Pd, Pt, Ir, Ru, Rh and their alloys.

33. The method as recited in claim 24, wherein said second mask layer comprises Cu or Ni.

34. The method as recited in claim 24, wherein said second mask layer is electroplated.

* * * * *